(12) United States Patent
Levitsky et al.

(10) Patent No.: US 6,378,113 B1
(45) Date of Patent: Apr. 23, 2002

(54) BLACK BOX TRANSPARENCY IN A CIRCUIT TIMING MODEL

(75) Inventors: Oleg Levitsky; Paul Berevoescu, both of San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 09/428,603

(22) Filed: Oct. 27, 1999

(51) Int. Cl.[7] .............................................. G06F 17/50
(52) U.S. Cl. ............................................. 716/6; 703/19
(58) Field of Search .............................. 716/1, 2, 4, 6; 703/19

(56) References Cited

U.S. PATENT DOCUMENTS

| | | | |
|---|---|---|---|
| 5,740,347 A | 4/1998 | Avidan | 395/183.09 |
| 5,790,830 A | 8/1998 | Segal | 395/500 |
| 6,023,568 A | * 2/2000 | Segal | 716/6 |
| 6,158,022 A | * 12/2000 | Avidan | 714/33 |

* cited by examiner

Primary Examiner—Matthew Smith
Assistant Examiner—Leigh Marie Garbowski
(74) Attorney, Agent, or Firm—Wagner Murabito & Hao LLP (57) ABSTRACT

A modeling method to incorporate transparency into black box models using setup time in a circuit timing model. The circuit timing model, comprising a plurality of latches initially represented using black box models, is generated. For each of the plurality of latches, an arrival time is calculated from the latch clock pin to an interface data output pin of the timing model, and the maximum arrival time is determined. For each of the plurality of latches, a setup time is calculated. A setup time is also calculated using the delay time from the interface data input pin to the interface data output pin and the maximum arrival time. The worst-case set up time is selected from these setup times and imposed at the interface data input pin. Satisfaction of the worst-case setup time causes the maximum arrival time to also be satisfied. Therefore, a transparent path through the latches in a black box timing model cannot generate an arrival time at the interface data output pin greater than the maximum permissible arrival time. Thus, the timing constraints used in the black box timing model are not unnecessarily restrictive.

25 Claims, 8 Drawing Sheets

BLACK BOX TRANSPARENCY IN A CIRCUIT TIMING MODEL

TECHNICAL FIELD

The present invention relates to the field of electronic design automation and circuit timing analysis models. In particular, the present invention pertains to a method for modeling transparency in a black box timing model.

BACKGROUND ART

Integrated circuits can be represented as netlists within electronic design automation systems. A circuit timing analyzer takes a netlist of a circuit and the associated timing information for a circuit, and abstracts them to get a timing representation of the circuit. The timing model is then used by a circuit analyzer to predict the overall performance of the circuit, identify critical paths in the circuit, and find timing violations. A timing analysis estimates the signal propagation delays through a netlist. Prior art circuit analyzers are described by U.S. Pat. No. 5,740,347, entitled "Circuit Analyzer of Black, Gray and Transparent Elements," by Jacob Avidan, issued Apr. 14, 1998, and by U.S. Pat. No. 5,790,830, entitled "Extracting Accurate and Efficient Timing Models of Latch-Based Designs," by Russell B. Segal, issued Aug. 4, 1998, herein incorporated by reference in their entirety.

One common type of timing model known in the art is a black box model. A black box model uses setup and hold times between a data input pin and a clock, clock-to-output pin delays, input-to-output combinational delays, and other timing information to analyze the timing behavior of a circuit, typically in the context of surrounding circuits. Black box modeling has some advantages and so is widely used in prior art circuit analyzers. For example, black box modeling can reduce the size of timing models so that they require less memory in a computer system and can be processed faster. Reducing size and speeding up processing are desirable attributes, in particular for large and complex circuits, especially when these circuits are designed and analyzed at the transistor level.

Figure 1:
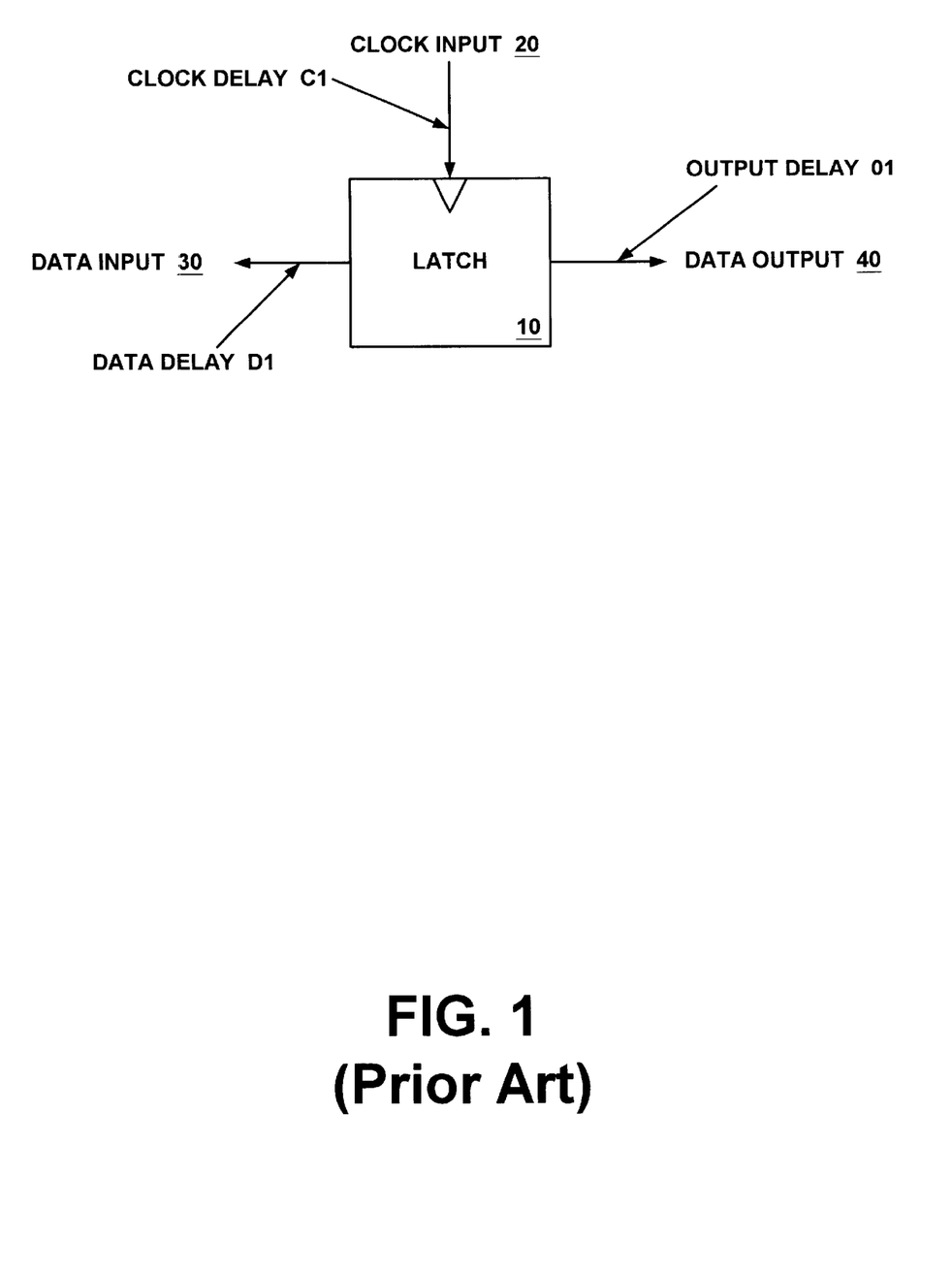
FIG. 1 illustrates one embodiment of a latch used in a black box timing model.

Prior Art FIG. 1 exemplifies a latch 10 used in a black box model. Input data are provided to latch 10 via data input pin 30, and the output of latch 10 is via data output pin 40. A clock signal is connected to latch 10 via clock input pin 20. Some latches are active when the clock signal is at high voltage ("active high"), and some latches are active when the clock signal is at low voltage ("active low"). For a clock that is active high, for example, when the clock signal transitions from high voltage to low voltage, the input data are latched and held until the clock transitions back to high again, when new data are latched.

Due to the physical characteristics of electronic circuitry, the input data must be available at data input pin 30 a certain amount of time before the clock signal transitions, in order for the input data to reach a stable state before it is latched. This time is referred to as setup time. Setup time is the difference between the clock delay Cl and the data delay D1; thus, setup time=D1−C1.

Setup time can be a function of either the leading edge or the trailing edge of the clock signal. In the former case, the data input must arrive at data input pin 30 before the clock signal transitions to its active state; in the latter case, latch 10 can sample data after the clock transitions to its active state.

A disadvantage to black box modeling is that in the modeling a latch is not permitted to sample data after the clock transitions to its active state (that is, after the leading edge of the clock signal), even though the circuit may actually sense data after that point in time. Thus, a disadvantage to black box modeling is that it does not support latch transparency. As a result, black box modeling can lead to overly restrictive constraints being placed on a circuit design, by requiring that data arrive at data input pin 30 before the clock signal transitions to its active state, when in fact it may be acceptable for the data to arrive afterwards. For instance, in some cases it might be possible for the input data to become stable in less than a clock cycle, and in those cases it would be acceptable for the data to arrive after the clock transitions to its active state. However, as already noted, black box modeling does not permit this to occur.

Conversely, black box modeling can introduce too strict timing constraints into the circuit analysis by predicting that the timing of a circuit is not satisfactory, when in reality the design of the circuit might be acceptable. For instance, the model might indicate that the data arrived at input pin 30 too late (e.g., after the clock has transitioned to its active state), although in reality the data might have arrived with enough time remaining in the clock cycle for the data to stabilize, as explained above.

In addition, when a circuit analyzer is applied at the transistor level of a circuit (that is, at the lowest level in the hierarchy of the timing analysis), a higher level of accuracy is desired for the circuit analysis. Therefore, a reduction in accuracy due to the prior art technique for black box modeling is particularly undesirable at the transistor level, and can lead to too strict timing constraints.

Accordingly, a need exists for a method to analyze the timing of a circuit without the unnecessarily restrictive constraints that can be placed on the circuit design when black box models are used. A need also exists for a method that accomplishes the above need and can be implemented at the transistor level. The present invention solves these needs. These and other objects and advantages of the present invention will become clear to those of ordinary skill in the art in light of the following detailed description of the preferred embodiments which are illustrated in the various drawing figures.

DISCLOSURE OF THE INVENTION

The present invention provides a method and system thereof that does not unnecessarily place restrictive constraints on a circuit design. The present invention also provides a method and system thereof for analyzing the timing of a circuit that can be implemented in circuit analyzers that use black box models. Furthermore, the present invention provides a method and system thereof that can be implemented at the transistor level.

The present invention pertains to a modeling method to incorporate transparency into black box models. A method is described for modeling transparency using setup time in a circuit timing model. By introducing transparency into a black box model, the timing constraints applied in the timing model can be relaxed.

In the present embodiment, input data are generated based on a netlist for a circuit comprising a plurality of latches. For each of the plurality of latches, an arrival time is calculated from the latch clock pin to an interface data output pin of the timing model, and the maximum arrival time is determined. A path search from the interface data input pin can be performed, and the latches on the path are found. For each of the latches, a setup time is calculated. A setup time is also calculated using the delay time from the interface data input pin to the interface data output pin and the maximum arrival time (that is, the interface data output pin is treated as a "dummy latch"). The worst-case setup time is selected from these setup times and imposed at the interface data input pin. Satisfaction of the worst-case setup time causes the maximum arrival time to also be satisfied. Therefore, a transparent path through the latches in the black box timing model cannot generate an arrival time at the interface data output pin greater than the maximum permissible arrival time.

In one embodiment, at least one of the plurality of latches represents the transistor level of the circuit.

In alternate embodiments, the present invention can be implemented in a timing model having a plurality of interface data input pins and/or a plurality of interface data output pins. A path search is performed to trace the various paths in the circuit.

The black box timing model generated in accordance with the present invention can be used with a plurality of other timing models in a hierarchical timing analysis that can include the transistor level.

BRIEF DESCRIPTION OF THE DRAWINGS

The accompanying drawings, which are incorporated in and form a part of this specification, illustrate embodiments of the invention and, together with the description, serve to explain the principles of the invention.

PRIOR ART

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. A procedure, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, bytes, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "generating" or "calculating" or "identifying" or "determining" or "implementing" or the like, refer to the action and processes of a computer system (e.g., the process of FIGS. 5A and 5B), or similar electronic computing device, that manipulates and transforms data represented as physical (electronic) quantities within the computer system's registers and memories into other data similarly represented as physical quantities within the computer system memories or registers or other such information storage, transmission or display devices.

Figure 2:
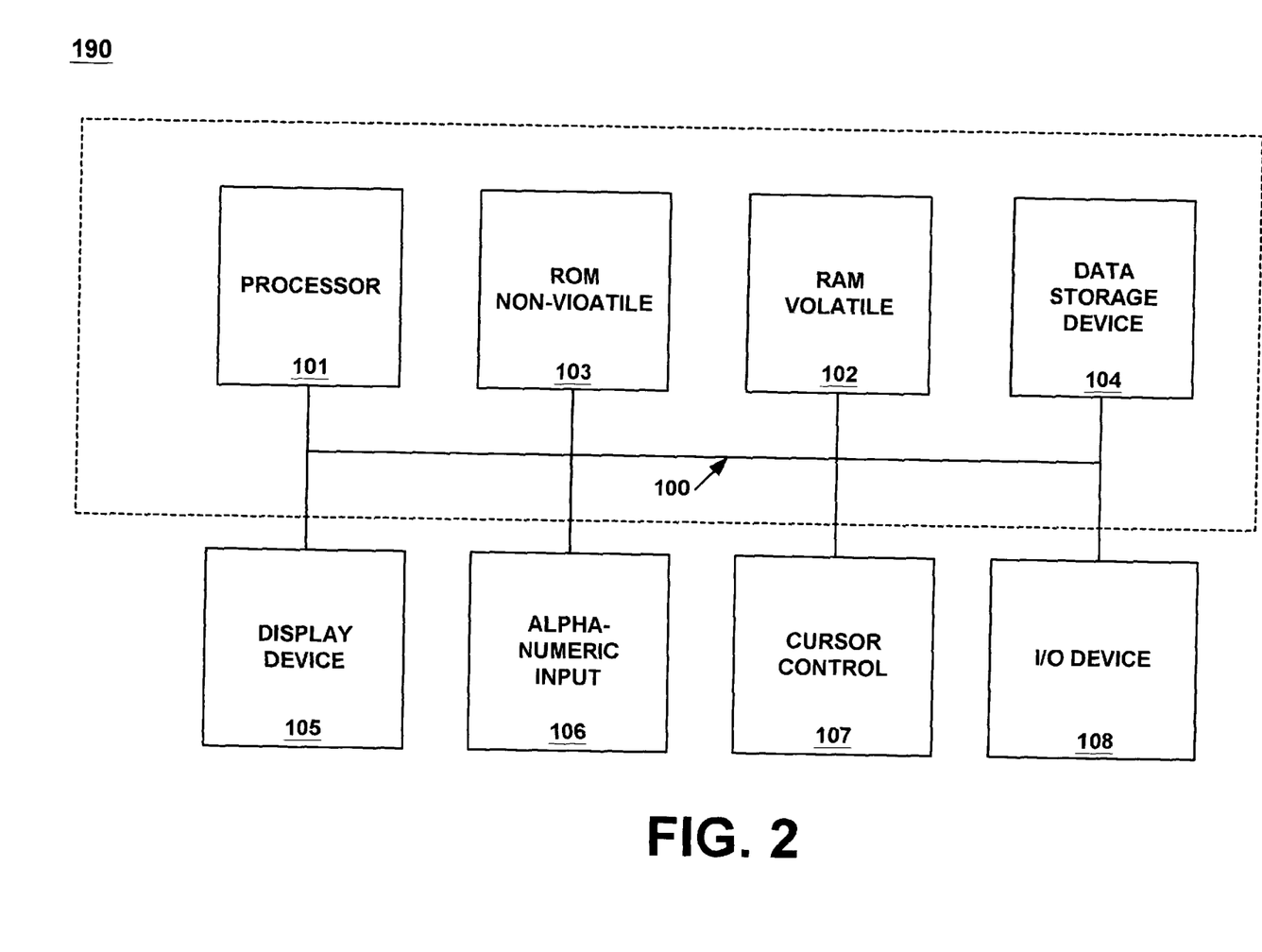
FIG. 2 is a block diagram of an exemplary computer system upon which embodiments of the present invention may be practiced.

Refer now to FIG. 2, which illustrates an exemplary computer system 190 upon which embodiments of the present invention may be practiced. In general, computer system 190 comprises bus 100 for communicating information, processor 101 coupled with bus 100 for processing information and instructions, random access (volatile) memory 102 coupled with bus 100 for storing information and instructions for processor 101, read-only (non-volatile) memory 103 coupled with bus 100 for storing static information and instructions for processor 101, data storage device 104 such as a magnetic or optical disk and disk drive coupled with bus 100 for storing information and instructions, an optional user output device such as display device 105 coupled to bus 100 for displaying information to the computer user, an optional user input device such as alphanumeric input device 106 including alphanumeric and function keys coupled to bus 100 for communicating information and command selections to processor 101, and an optional user input device such as cursor control device 107 coupled to bus 100 for communicating user input information and command selections to processor 101. Furthermore, an optional input/output (I/O) device 108 is used to couple the computer system 190 onto, for example, a network.

Display device 105 utilized with computer system 190 may be a liquid crystal device, cathode ray tube, or other display device suitable for creating graphic images and alphanumeric characters-recognizable to the user. Cursor control device 107 allows the computer user to dynamically signal the two-dimensional movement of a visible symbol (pointer) on a display screen of display device 105. Many implementations of the cursor control device are known in the art including a trackball, mouse, joystick or special keys on alphanumeric input device 106 capable of signaling movement of a given direction or manner of displacement. It is to be appreciated that the cursor control 107 also may be directed and/or activated via input from the keyboard using special keys and key sequence commands. Alternatively, the cursor may be directed and/or activated via input from a number of specially adapted cursor directing devices.

In accordance with the present invention, processor 101 executes a circuit analyzer stored as computer-readable instructions in random access (volatile) memory 102, read-only (non-volatile) memory 103, and/or data storage device 104. The circuit analyzer is used to estimate the overall performance of a circuit, identify critical paths in the circuit, and find timing violations, and the like.

Circuit analyzers are described by U.S. Pat. No. 5,740,347, entitled "Circuit Analyzer of Black, Gray and Transparent Elements," by Jacob Avidan, issued Apr. 14, 1998, and by U.S. Pat. No. 5,790,830, entitled "Extracting Accurate and Efficient Timing Models of Latch-Based Designs," by Russell B. Segal, issued Aug. 4, 1998, herein incorporated by reference in their entirety. However, it is appreciated that the present invention may be implemented using various circuit analyzers.

Some circuit analyzers model the circuit or portions of the circuit (e.g., functional blocks) using black box models of latches. The present invention enables transparency to be modeled in a black box model, and therefore the present invention can be implemented with circuit analyzers that use black box modeling. In the present embodiment, transparency is represented in the black box model in terms of setup time.

Figure 3A:
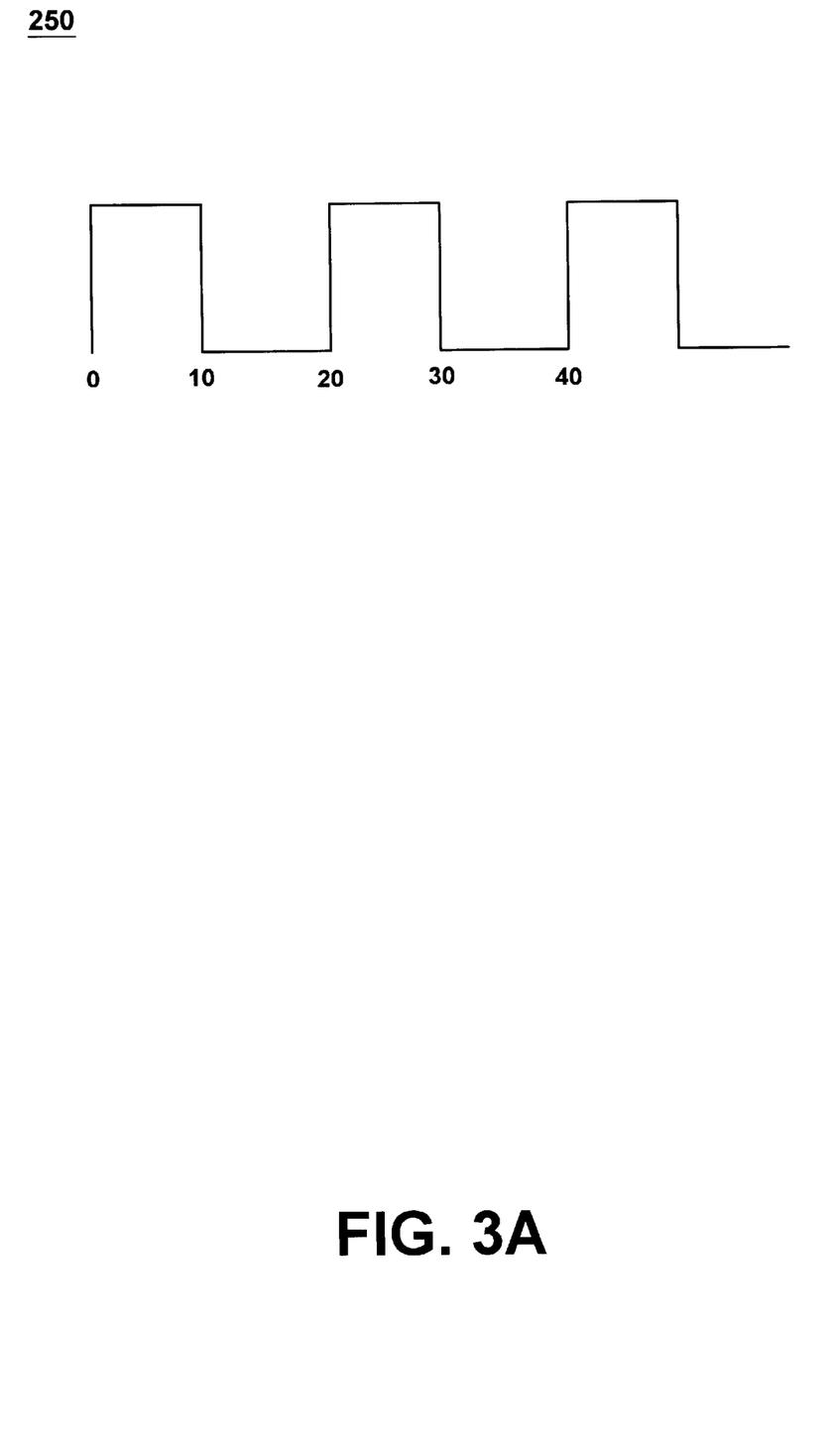
FIG. 3A is an illustration of a clock signal used in a circuit timing model in accordance with one embodiment of the present invention.

FIG. 3A shows an exemplary embodiment of a clock signal 250 with alternating active states and inactive states, each 10 nano-seconds in length; however, it is appreciated that other periods of time may be associated with clock signal 250 in accordance with the present invention. In one embodiment, clock signal 250 is "active high;" that is, when clock signal 250 is at its higher value, then input data can be latched. In a similar manner, clock signals can also be "active low," in which case input data are latched when clock signal 250 is at its lower value. The present invention is discussed in the context of a clock signal that is active high; however, it is appreciated that the present invention can also be used with a clock signal that is active low. It is further appreciated that, in a similar manner, a data signal can either be active high or active low in accordance with the present invention.

Figure 3B:
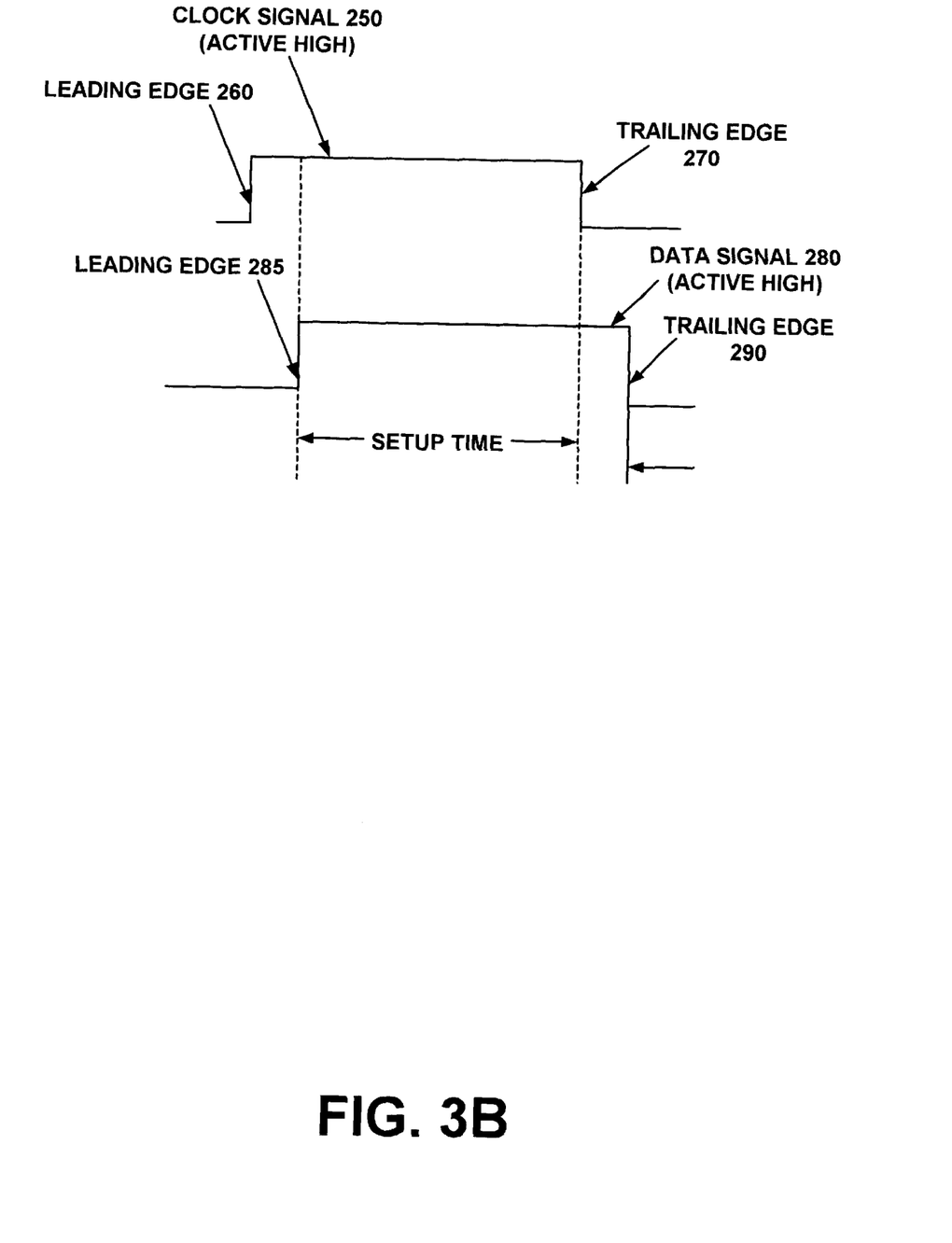
FIG. 3B is an illustration of clock and data signals used in a circuit timing model in accordance with one embodiment of the present invention.

FIG. 3B shows a portion of clock signal 250 with leading edge 260 and trailing edge 270. Also shown is data signal 280 with leading edge 285 and trailing edge 290. Due to the physical characteristics of the circuitry, data signal 280 must be available a certain amount of time before clock signal 250 transitions to its lower voltage (when active high) or its higher voltage (when active low); this is referred to as the setup time.

In the exemplary scenario illustrated by FIG. 3B, data signal 280 arrives after leading edge 260 of clock signal 250, and the setup time is short enough to allow the data to be available when clock signal 250 transitions to its lower voltage. In fact, in this case, the setup time is short enough so that there is an interval between leading edge 260 of clock signal 250 and leading edge 285 of data signal 280. For a latch not limited by setup time, the amount of time data signal 280 can arrive after leading edge 260 is equal to the amount of time between leading edge 260 and leading edge 285.

In accordance with the present invention, the arrival of data signal 280 after leading edge 260 of clock signal 250 can be modeled in a black box timing model. In the present embodiment, the present invention models transparency in black box models in terms of setup time. Accordingly, the present invention can be implemented in circuit analyzers that utilize black box timing models. Additional information is provided below in conjunction with FIGS. 5A and 5B.

With reference still to FIG. 3B, in accordance with the present invention, the interval between leading edge 260 of clock signal 250 and leading edge 285 of data signal 280 can be captured and advantageously applied to model transparency in a black box timing model. Accordingly, the present invention does not unnecessarily place restrictive constraints on a circuit design that are typically associated with black box models such as, for example, a requirement that data signal 280 arrive prior to the leading edge of clock signal 250.

Figure 4A:
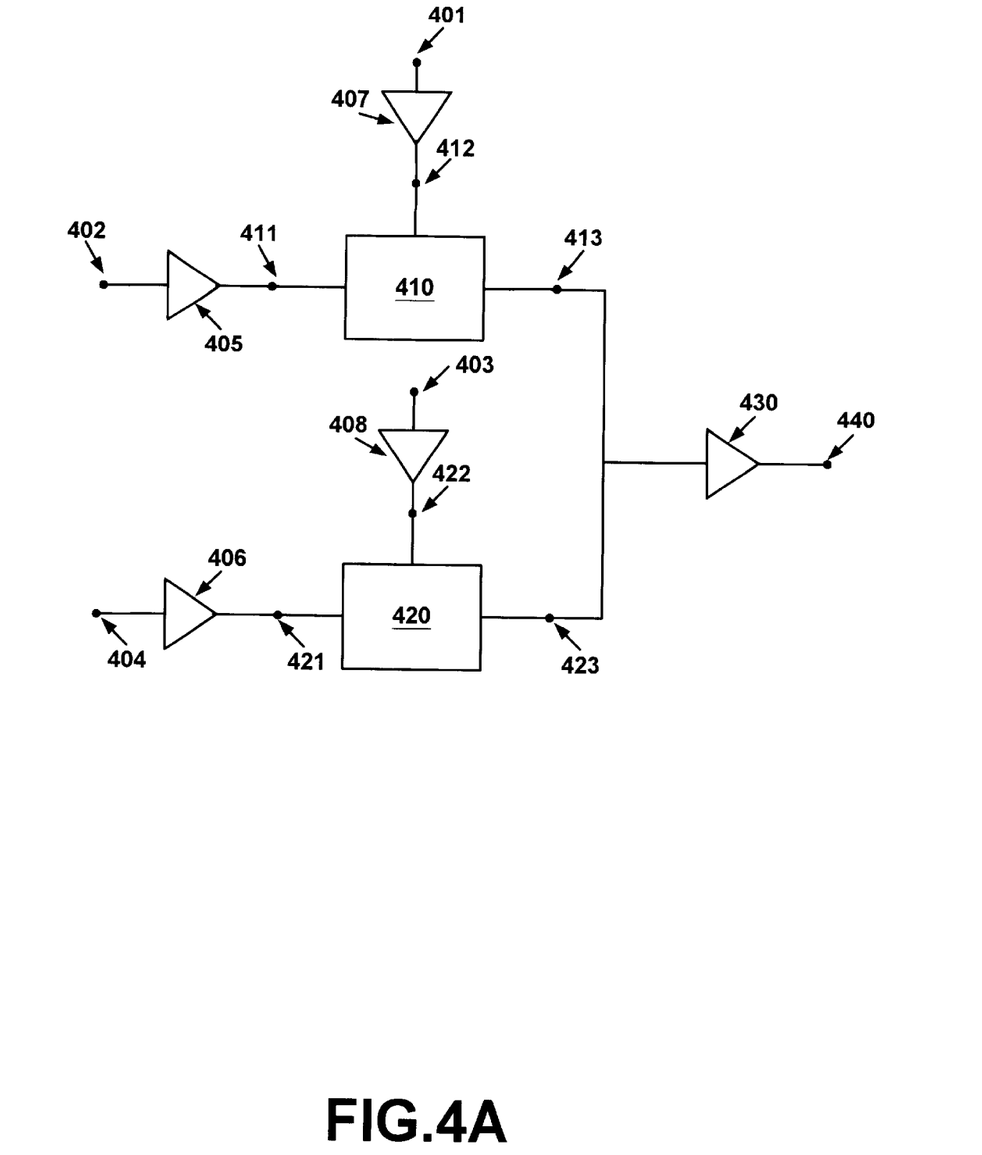
FIG. 4A is a diagram of one embodiment of an exemplary circuit modeled by a circuit timing model in accordance with the present invention.

FIG. 4A is an illustration of an exemplary circuit 400 that can be used for modeling transparency in a black box timing model in accordance with one embodiment of the present invention. It is appreciated that circuit 400 may represent a portion of a larger circuit. In the present embodiment, circuit 400 comprises two latches 410 and 420 that each represent physical (hardware) components of a circuit design, including transistors. However, it is appreciated that a different number of latches may be used in accordance with the present invention. Furthermore, it is appreciated that circuit 400 is an exemplary circuit, and other circuit configurations may be used in accordance with the present invention.

Latch 410 has data input pin 411, clock pin 412, and data output pin 413, and similarly latch 420 has data input pin 421, clock pin 422, and data output pin 423. Latches 410 and 420 are joined through logic 430 to interface data output pin 440 (output pin 440 is the interface output pin). Circuit 400 has interface data pin 402 connected via logic 405 to input 411, interface data pin 404 connected via logic 406 to data input 421., interface clock pin 401 connected via logic 412 to clock pin 412, and interface clock pin 403 connected via logic 408 to clock pin 422. It is appreciated that interface clock pin 401 and interface clock pin may or may not be connected to the same clock.

Continuing with reference to FIG. 4A, the time it takes for a data signal (not shown) and/or a clock signal (not shown) to propagate through circuit 400 to output pin 440 can be different depending on the path the signal takes. That is, a data signal and/or a clock signal traveling via the path through latch 410 can be expected to be delayed by a different amount of time than a similar data signal and/or clock signal traveling via the path through latch 420. For example, the following delay times may be used to characterize the performance of circuit 400 for illustration purposes ("ar" refers to after the rising edge, or leading edge, of a clock signal):

clock pin 401-to-output pin 440: 5 nano-seconds ar clock signal
clock pin 403-to-output pin 440: 8 nano-seconds ar clock signal
clock pin 401-to-output pin 413: 2 nano-seconds ar clock signal
clock pin 413-to-output pin 440: 3 nano-seconds ar clock signal clock pin 403-to-output pin 423: 3 nano-seconds ar clock signal clock pin 423-to-output pin 440: 5 nano-seconds ar clock signal In this example, the worst delay time (e.g., the maximum arrival time that is permissible) from a clock pin to output pin 440 is 8 nano-seconds (after a rising edge of a clock signal), from clock pin 403 to output pin 440. Thus, the amount of transparency through latch 420 is 3 nano-seconds (8 minus 5, the difference between the maximum arrival time and the delay from clock pin 420 to output pin 440). Similarly, the amount of transparency through latch 410 is 5 nano-seconds (8 minus 3, the difference between the maximum arrival time and the delay from clock pin 413 to output pin 440).

With reference back to FIG. 3B and continuing with reference to FIG. 4A, for latch 420, the interval between leading edge 260 of clock signal 250 and leading edge 285 of data signal 280 cannot be greater than 3 nano-seconds. Similarly, for latch 410, the interval between leading edge 260 of clock signal 250 and leading edge 285 of data signal 280 cannot be greater than 5 nano-seconds. Accordingly, any transparent path through either latch 410 or latch 420 and satisfying these criteria cannot generate an arrival time at output pin 440 greater than the maximum arrival time that is permissible (e.g., 8 nano-seconds after the rising edge of the clock signal). In accordance with the present invention, transparency is introduced into a black box timing model in terms of the setup time; this is further described in conjunction with FIG. 4B.

Figure 4B:
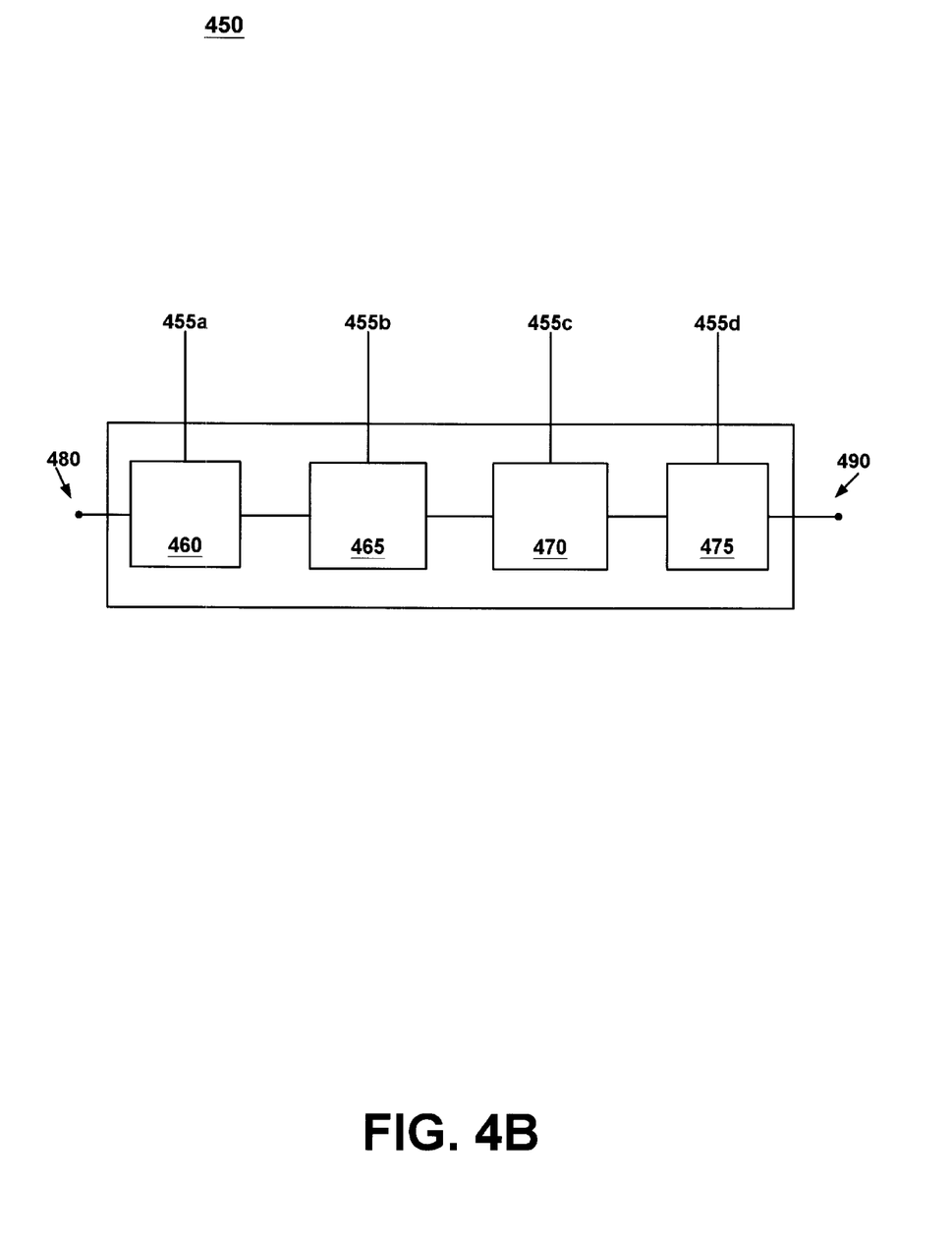
FIG. 4B is a diagram of another embodiment of an exemplary circuit modeled by a circuit timing model in accordance with the present invention.

FIG. 4B is an illustration of another exemplary circuit 450 that can be used for modeling transparency in a black box timing model in accordance with one embodiment of the present invention. Circuit 450 has interface data input pin 480 and interface data output pin 490. In this embodiment, circuit 450 comprises latches 460, 465, 470 and 475 connected in series, such that the output from one latch serves as the input to a succeeding latch. In a manner similar to that illustrated by FIG. 4A, associated with each latch is a clock pin 455a–d. Each clock pin 455a–d is connected via a combinational logic (not shown) to a respective interface clock pin (not shown) that may or may not be connected to the same clock (not shown). Also associated with each clock pin is a data input pin (not shown) and a data output pin (not shown). The data input pin for latch 460 is connected to interface data input pin 480 via combinational logic (now shown), and similarly the data output pin for latch 475 is connected via combinational logic (now shown) to interface data output pin 490. It is appreciated that a different number of latches or a different arrangement of latches may be used in accordance with the present invention. It is further appreciated that there may be more than one interface data input pin 480 and/or more than one interface data output pin 490 associated with circuit 450 in accordance with the present invention.

With reference still to FIG. 4B, in accordance with the present invention, the amount of transparency is determined for each latch 460, 465, 470 and 475 in a manner similar to that described for latches 410 and 420 of FIG. 4A. The amount of transparency for each latch 460, 465, 470 and 475 is translated into terms of setup time. In accordance with the present invention, interface data output pin 490 is treated as a "dummy latch," and the amount of transparency for this dummy latch is also determined and translated into terms of setup time. The setup time for each latch (including the dummy latch) is propagated back to interface data input pin 480 in the timing model, and the worst-case setup time is imposed on circuit 450 at that point.

Continuing with reference to FIG. 4B, in the present embodiment, the setup time is determined for latch 460, propagated back to interface data input pin 480, and saved. Similarly, the setup time is determined for latch 465 and propagated back to interface data input pin 480. The setup time for latch 465 is compared to the value already stored, and the worst-case value based on this comparison is saved. This process is repeated for latches 470 and 475. For interface data output pin 490 (the dummy latch), the setup time is determined based on the maximum arrival time, propagated back to interface data input pin 480, compared to the value already stored, and the worst-case value based on this comparison is saved. Thus, the worst-case setup time for circuit 450 is imposed at interface data input pin 480. Accordingly, a transparent path through latches 460, 465, 470 and/or 475 that satisfies the worst-case setup time cannot generate an arrival time at interface data output pin 490 greater than the maximum permissible arrival time.

Circuit 450 may represent a portion of a larger circuit. A black box timing model with transparency generated in accordance with the present invention for circuit 450 can be combined with other timing models for other circuits to represent a larger circuit in a hierarchical timing analysis. For analysis purposes, a circuit can be considered as a collection of interconnected functional blocks. The circuit can be specified hierarchically, with higher level functional blocks encompassing one or more lower level blocks. A higher level functional block may be a subcircuit composed of other lower level functional blocks that may also be subcircuits. In a hierarchical timing analysis, the overall circuit is analyzed using a multiplicity of integrated timing models that each represent a functional block at the next lower level. Each of these functional blocks is in turn composed of a multiplicity of timing models that each represent a functional block at the next lower level, and so on.

Thus, in a hierarchical timing analysis, input pin 480 can be connected to an output pin of a timing model representing a preceding functional block, and output pin 490 can be connected to an input pin of a timing model representing a succeeding functional block. Accordingly, if the input at input pin 480 satisfies the worst-case setup time that is imposed there (as described above), then the resultant arrival time at output pin 490 is also the worst case, and consequently the input to the next timing model is also the worst case. In other words, if the worst-case setup time is satisfied at input pin 480, then there is not a transparent path from input pin 480 that would generate an arrival time at output pin 490 that would exceed the maximum arrival time, and this information can then be applied to timing models that are downstream of circuit 450 in a hierarchical timing analysis.

Figure 5A:
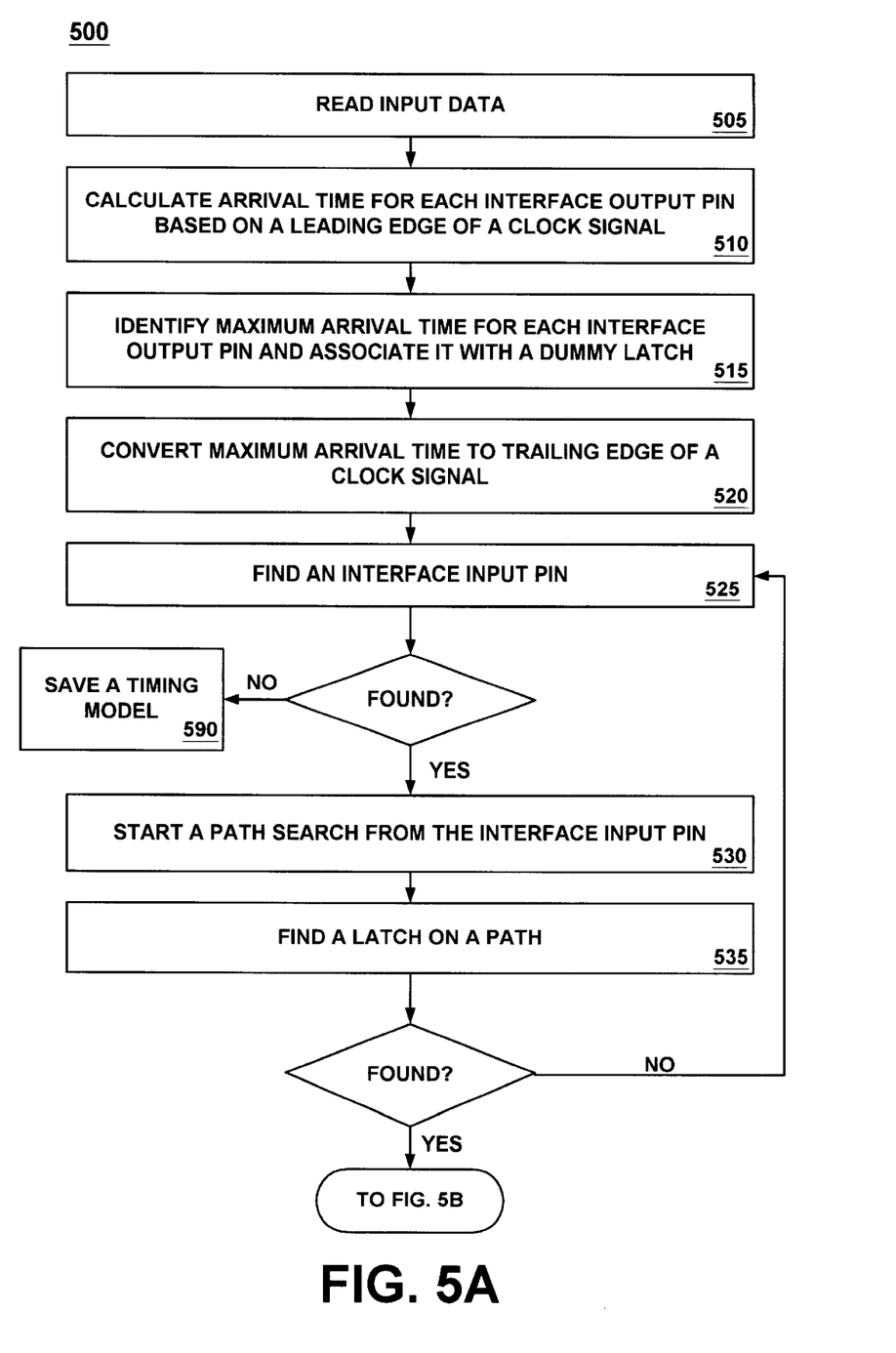
FIGS. 5A and 5B are flowcharts of the steps in a process for modeling transparency in a black box model in accordance with one embodiment of the present invention.
Figure 5B:
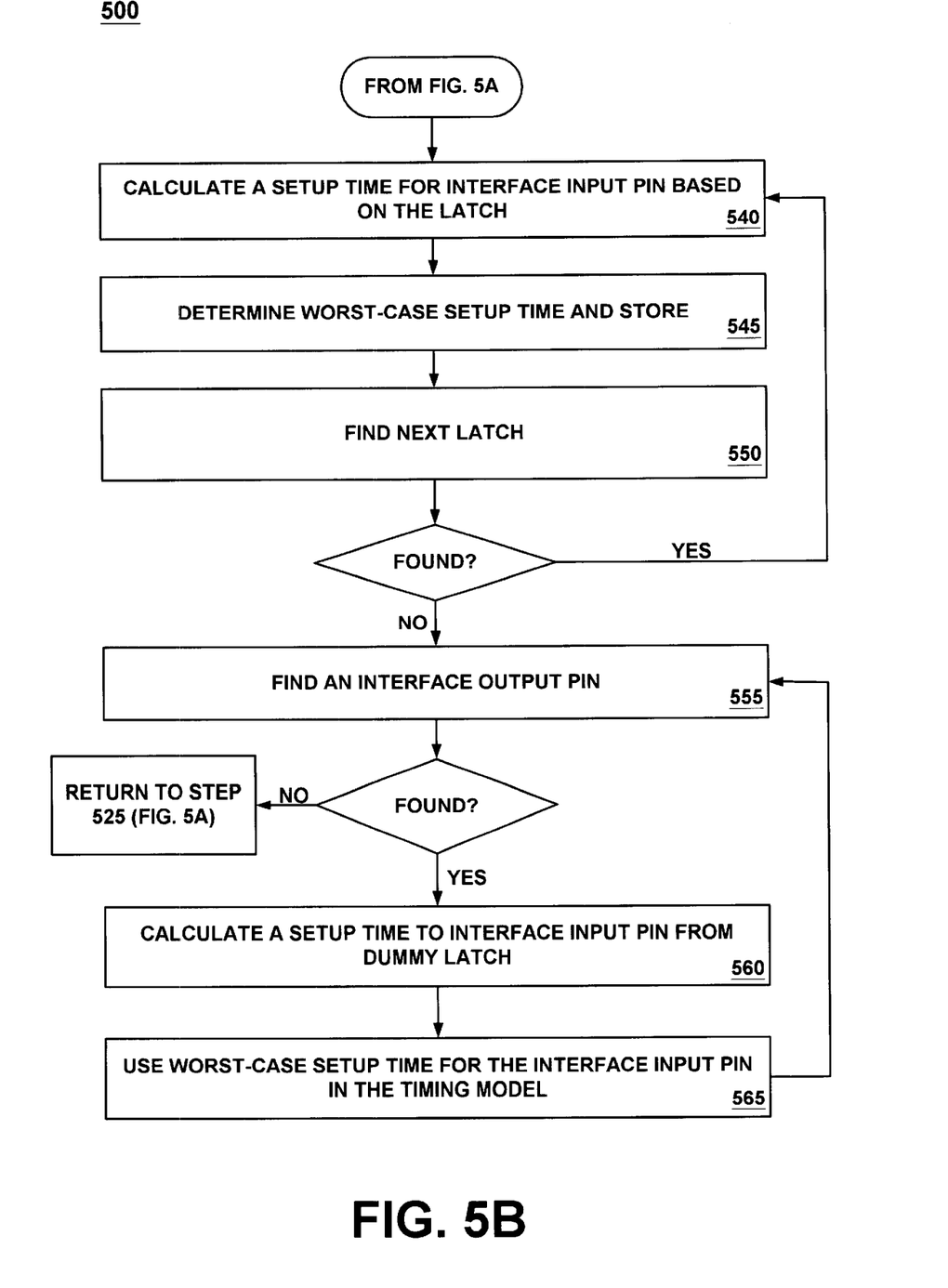

FIGS. 5A and 5B are flowcharts of the steps in a process 500 for modeling transparency in a black box model of a circuit (e.g., circuit 400 of FIG. 4A or circuit 450 of FIG. 4B) in accordance with one embodiment of the present invention. In the present embodiment, process 500 models transparency in terms of setup time. Process 500 is implemented via computer-readable program instructions stored in a memory unit (e.g., random access memory 102, read-only memory 103, and/or data storage device 104) and executed by processor 101 of computer system 190 (FIG. 2).

In step 505 of FIG. 5A, input data are generated for a circuit based on a netlist using a known technique, and the input data are read from computer system memory.

In step 510 of FIG. 5A, arrival times are calculated at an interface data output pin (e.g., output pin 440 of FIG. 4A or output pin 490 of FIG. 4B) considering each of the latches on the path(s) connected to that output pin. If there are more than one interface data output pins, the arrival times are calculated for each one. At this point in process 500, the timing information is with respect to the leading edge of the clock signal (e.g., leading edge 260 of FIG. 3B).

In step 515 of FIG. 5A, the maximum arrival time is determined for the interface data output pin (e.g., output pin 440 of FIG. 4A or output pin 490 of FIG. 4B). If there are more than one interface data output pins, the maximum arrival time is calculated for each one. In accordance with the embodiment of the present invention, it is useful to consider each interface data output pin (e.g., output pin 440 of FIG. 4A or output pin 490 of FIG. 4B) as a "dummy latch," although the dummy latch is not explicitly modeled as a latch. The maximum arrival time associated with each dummy latch is stored.

In step 520 of FIG. 5A, the maximum arrival time for each dummy latch is converted so that it is with respect to the trailing edge of the clock signal (e.g., trailing edge 270 of FIG. 3B).

In step 525 of FIG. 5A, an interface data input pin (e.g., input pin 402 or 404 of FIG. 4A or input pin 480 of FIG. 4B) is selected. In the present embodiment, each interface data input pin will eventually be selected and considered in the analysis.

In step 530 of FIG. 5A, a path search is started from the interface data input pin selected in step 525 (for clarity, this will be referred to herein as the "selected interface data input pin"). A path search is typically performed using a known technique and can trace every path in a given circuit.

In step 535 of FIG. 5A, for the path traced in step 530, a latch is found.

For the latch found in step 535, process 500 continues to step 540 of FIG. 5B. In step 540, the setup time for the latch is calculated. This setup time is propagated back to the interface data input pin that is associated with the path the latch is on (that is, the present interface data input pin identified by step 525 of FIG. 5A).

In step 545 of FIG. 5B, the worst-case setup time is determined and saved for the present interface data input pin. If only one latch has been analyzed so far, then the setup time for that latch is saved as the worst-case value. For each latch subsequently analyzed, the setup time is calculated for that latch and compared to the currently saved value. Based on this comparison, the worst-case value of setup time is determined and saved. In accordance with the present embodiment of the present invention, as process 500 is performed for each interface data input pin, a worst-case setup time will be associated with each interface data input pin as the evaluation of that pin is completed.

In step 550 of FIG. 5B, a next latch on the path associated with the present interface data input pin is found and steps 540–550 are repeated for this next latch. If no latch is found in step 550, process 500 proceeds instead to step 555.

In step 555 of FIG. 5B, an interface data output pin on the path associated with the present interface data input pin is found. If an interface data output pin is not found (that is, once all of the interface data output pins identified by the path search for the present interface data input pin are found), process 500 returns to step 525 (FIG. 5A) to find the next interface data input pin.

In step 560 of FIG. 5B, in the present embodiment, a setup time is determined for the dummy latch (step 515) associated with the interface data output pin currently being evaluated (the pin identified in step 555). This setup time is determined using the delay time from the present interface data input pin to the interface data output pin found in step 555, and also uses the maximum arrival time for this interface data output pin.

In step 565 of FIG. 5B, the setup time calculated in step 560 is compared to the worst-case setup time (from step 545) for the present interface data input pin. Based on this comparison, the worst-case setup time is determined and stored. Process 500 then returns to step 555. Thus, as process 500 is performed for each interface data input pin, a worst-case setup time will be associated with each interface data input pin as it is evaluated in accordance with the present invention.

Once the interface data input pins, latches, paths and interface data output pins have been evaluated according to steps 525–565 of process 500, the black box model with transparency is saved in a memory unit of a computer system (e.g., RAM 102 of FIG. 2) for subsequent use in a circuit analyzer (step 590 of FIG. 5A).

Thus, in accordance with the present embodiment of the present invention, upon completion of process 500 (FIGS. 5A and 5B), a worst-case setup time is associated with each interface data input pin (e.g., input pin 402 or 404 of FIG. 4A or input pin 480 of FIG. 4B). In the present embodiment, the worst-case setup time for a timing model is imposed at the interface data input pin. The worst-case setup time is calculated based on the setup time for each latch being considered as well the interface data output pin (the dummy latch); for the dummy latch, the setup time is based on the maximum arrival time. Therefore, a transparent path through the latches in the timing model cannot generate an arrival time at an interface data output pin greater than the maximum permissible arrival time. In other words, if the setup time imposed at an interface data input pin of a timing model is satisfied, then there is not a transparent path from that input pin that would generate an arrival time at an interface data output pin that would exceed the maximum arrival time.

In summary, the present invention models transparency in black box timing models in terms of setup time. The circuit timing model generated in accordance with the present invention can be used in a hierarchical timing analysis with a plurality of other circuit timing models. The present invention can be implemented in circuit analyzers that use black box models. The present invention also does not unnecessarily place restrictive constraints on a circuit design. Furthermore, the present invention can be implemented at the transistor level.

The preferred embodiment of the present invention, black box transparency in a circuit timing model, is thus described. While the present invention has been described in particular embodiments, it should be appreciated that the present invention should not be construed as limited by such embodiments, but rather construed according to the following claims.

What is claimed is:

1. A method for modeling latch transparency using setup time in a circuit timing model having an interface data input pin, an interface data output pin, and a plurality of latches with each latch receiving a data signal and a clock signal, said method comprising the steps of:

a) for each of said plurality of latches, calculating an arrival time from a latch clock pin to said interface data output pin;

b) identifying a maximum arrival time from said step a);

c) calculating a setup time for each of said plurality of latches;

d) calculating a setup time associated with said interface data output pin using said maximum arrival time;

e) identifying a worst-case setup time from said step c) and said step d); and f) implementing said worst-case setup time at said interface data input pin, wherein satisfaction of said worst-case setup time causes said maximum arrival time to also be satisfied and introduces latch transparency in said circuit timing model.

2. The method for modeling latch transparency as recited in claim 1 wherein said arrival time is based on a leading edge of a clock signal.

3. The method for modeling latch transparency as recited in claim 2 wherein said step a) further comprises the step of:

converting said arrival time based on said leading edge of said clock signal to an arrival time based on a trailing edge of said clock signal.

4. The method for modeling latch transparency as recited in claim 1 wherein said circuit timing model comprises a plurality of interface data input pins.

5. The method for modeling latch transparency as recited in claim 4 wherein a worst-case setup time is determined for each of said plurality of interface data input pins.

6. The method for modeling latch transparency as recited in claim 1 wherein said circuit timing model comprises a plurality of interface data output pins, said method further comprising the step of:

identifying a maximum arrival time for each of said plurality of interface data output pins.

7. The method for modeling latch transparency as recited in claim 1 wherein said step d) further comprises the steps of:

d1) calculating a setup time using a delay time from said interface data input pin to said interface data output pin and using said maximum arrival time;

d2) selecting a maximum setup time by comparing said setup time from said step d1) and a worst-case setup time from said step c); and d3) using said maximum setup time as said worst-case setup time for said step f).

8. The method for modeling latch transparency as recited in claim 1 wherein said plurality of latches are initially modeled using black box models.

9. The method for modeling latch transparency as recited in claim 1 wherein at least one of said plurality of latches is at a transistor level of said circuit.

10. The method for modeling latch transparency as recited in claim 1 wherein said circuit timing model is used in a hierarchical timing analysis with a plurality of other circuit timing models.

11. A computer system comprising:

a bus;

a processor coupled to said bus;

a computer-readable memory unit coupled to said bus;

said processor for executing a method modeling latch transparency using setup time in a circuit timing model having an interface data input pin, an interface data output pin, and a plurality of latches with each latch receiving a data signal and a clock signal, said method comprising the steps of:

a) for each of said plurality of latches, calculating an arrival time from a latch clock pin to said interface data output pin;

b) identifying a maximum arrival time from said step a);

c) calculating a setup time for each of said plurality of latches;

d) calculating a setup time associated with said interface data output pin using said maximum arrival time;

e) identifying a worst-case setup time from said step c) and said step d); and f) implementing said worst-case setup time at said interface data input pin, wherein satisfaction of said worst-case setup time causes said maximum arrival time to also be satisfied and introduces latch transparency in said circuit timing model.

12. The computer system of claim 11 wherein said arrival time is based on a leading edge of a clock signal.

13. The computer system of claim 12 wherein said step a) of said method further comprises the step of:

converting said arrival time based on said leading edge of said clock signal to an arrival time based on a trailing edge of said clock signal.

14. The computer system of claim 11 wherein said circuit timing model further comprises a plurality of interface data input pins.

15. The computer system of claim 14 wherein a worst-case setup time is determined for each of said plurality of interface data input pins.

16. The computer system of claim 11 wherein said circuit timing model further comprises a plurality of interface data output pins and said method further comprises the step of:

identifying a maximum arrival time for each of said plurality of interface data output pins.

17. The computer system of claim 11 wherein said step d) of said method further comprises the steps of:

d1) calculating a setup time using a delay time from said interface data input pin to said interface data output pin and using said maximum arrival time;

d2) selecting a maximum setup time by comparing said setup time from said step d1) and said worst-case setup time from said step c); and d3) using said maximum setup time as said worst-case setup time for said step f).

18. The computer system of claim 11 wherein said plurality of latches are initially modeled using black box models.

19. The computer system of claim 11 wherein at least one of said plurality of latches is at a transistor level of said circuit.

20. The computer system of claim 11 wherein said circuit timing model is used in a hierarchical timing analysis with a plurality of other circuit timing models.

21. A method for modeling transparency in a black box timing model using setup time, said method comprising the steps of:

a) generating a circuit timing model comprising a plurality of latches modeled using black box models, each latch receiving a data signal and a clock signal;

b) for each of said plurality of latches, calculating an arrival time from a latch clock pin to an interface data output pin of said black box timing model;

c) identifying a maximum arrival time from said step b);

d) calculating a setup time for each of said plurality of latches;

e) calculating a setup time using a delay time from an interface data input pin of said circuit timing model to said interface data output pin and using said maximum arrival time;

f) identifying a worst-case setup time from said step d) and said step e);

g) implementing said worst-case setup time at said interface data input pin, wherein satisfaction of said worst-case setup time causes said maximum arrival time to also be satisfied and introduces latch transparency in said black box timing model; and h) saving said black box models incorporating said transparency in a memory unit of a computer system for use in a circuit analyzer.

22. The method for modeling transparency in a black box timing model as recited in claim 21 wherein said arrival time is based on a leading edge of a clock signal.

23. The method for modeling transparency in a black box timing model as recited in claim 22 wherein said step b) further comprises the step of:

converting said arrival time based on said leading edge of said clock signal to an arrival time based on a trailing edge of said clock signal.

24. The method for modeling transparency in a black box timing model as recited in claim 21 wherein at least one of said plurality of latches is at a transistor level of said circuit.

25. The method for modeling transparency in a black box timing model as recited in claim 21 wherein said black box timing model is used in a hierarchical timing analysis with a plurality of other black box timing models.

* * * * *